(12) United States Patent
Godshalk et al.

(10) Patent No.: US 8,149,500 B2
(45) Date of Patent: Apr. 3, 2012

(54) BRAGG MIRROR AND METHOD FOR MAKING SAME

(75) Inventors: Ed Godshalk, Newberg, OR (US); Guillaume Bouche, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/697,242

(22) Filed: Jan. 30, 2010

(65) Prior Publication Data

US 2010/0123948 A1   May 20, 2010

Related U.S. Application Data

(62) Division of application No. 11/713,461, filed on Feb. 28, 2007, now Pat. No. 7,684,109.

(51) Int. Cl.
*G02F 1/33* (2006.01)
(52) U.S. Cl. .................................. 359/305; 359/313
(58) Field of Classification Search .................. 359/305, 359/310, 311, 313, 314; 333/189, 191, 192
See application file for complete search history.

(56) References Cited

U.S. PATENT DOCUMENTS

| | | | |
|---|---|---|---|
| 3,714,609 A | 1/1973 | Whitney et al. | |
| 6,441,703 B1 * | 8/2002 | Panasik | 333/189 |
| 6,451,414 B1 * | 9/2002 | Wheatley et al. | 428/212 |
| 6,749,427 B1 * | 6/2004 | Bretscher et al. | 433/30 |
| 6,933,807 B2 * | 8/2005 | Marksteiner et al. | 333/187 |
| 2005/0127352 A1 * | 6/2005 | Lambkin et al. | 257/14 |
| 2007/0065019 A1 * | 3/2007 | Yasuda et al. | 382/232 |
| 2009/0305147 A1 * | 12/2009 | Constancias | 430/5 |

* cited by examiner

*Primary Examiner* — William Choi
(74) *Attorney, Agent, or Firm* — Blakely Sokoloff Taylor & Zafman LLP (57) ABSTRACT

In an embodiment, set forth by way of example and not limitation, a Bragg mirror includes a first bi-layer of a first thickness and a second bi-layer of a second thickness which is different from the first thickness. In this exemplary embodiment, the first bi-layer consists essentially of a first high impedance layer and a first low impedance layer, and the second bi-layer of a second thickness which is different from the first thickness, the second bi-layer consisting essentially of a second high impedance layer and a second low impedance layer. Preferably, the first bi-layer is configured to substantially reflect a first wavelength and the second bi-layer is configured to substantially reflect a second wavelength different from the first wavelength.

12 Claims, 7 Drawing Sheets

BRAGG MIRROR AND METHOD FOR MAKING SAME

CROSS REFERENCE TO RELATED APPLICATION(S)

This application is a divisional of U.S. Ser. No. 11/713,461, filed Feb. 28, 2007, now U.S. Pat. No. 7,684,109, incorporated herein by reference.

BACKGROUND

This invention relates to wave reflectors and, in certain exemplary embodiments, Bragg mirrors used in conjunction with piezoelectric resonators.

Piezoelectric resonators are used for a number of purposes but are primarily used in the electronics industry for signal filtering and reference oscillators. These resonators are commonly referred to as FBAR (film bulk acoustic resonators) or BAW (bulk acoustic wave resonators). The resonator is preferably acoustically isolated from the mechanical substrate, e.g. a silicon wafer. This can be accomplished by an air gap for a FBAR or a Bragg mirror for a Solidly Mounted Resonator ("SMR"). Bragg mirrors have been developed in both microwave and optical applications to reflect energy waves.

As is well known to those skilled in the art, a Bragg mirror typically comprises alternating high and low acoustic impedance materials that are each ideally approximately one-quarter the wavelength ($\lambda/4$) thick at the operating frequency of the resonator. Adjacent high and low acoustic impedance layers are generally referred to as "bi-layers", and are approximately one-half the wavelength ($\lambda/2$) at the operating frequency of the resonators. These devices are well documented in the literature. See, for example, W. E. Newell, "Face-mounted piezoelectric resonators," in *proc. IEEE* vol. 53, June 1965, pp. 575-581.; L. N. Dworsky and L. C. B. Mang, "Thin Film Resonator Having Stacked Acoustic Reflecting Impedance Matching Layers and Method," U.S. Pat. No. 5,373,268, Dec. 13, 1994.; K. M. Lakin, G. R. Kline, R. S. Ketcham, and J. T. Martin, "Stacked Crystal Filters Implemented with Thin Films," in 43rd *Ann. Freq. Contr. Symp.*, May 1989, pp. 536-543.; and R. Aigner, J. Ella, H.-J. Timme, L. Elbrecht, W. Nessler, S. Marksteiner, "Advancement of MEMS into RF-Filter Applications," *Proc. of IEDM 2002*, San Francisco, Dec. 8-11, 2002, pp 897-900, all incorporated herein by reference.

Briefly, a Bragg mirror, also referred to as a "Bragg reflector" or a "quarter-wave mirror" is a structure which consists of an alternating sequence of layers of two different transmissive materials, with each transmissive layer thickness corresponding to one quarter of the wavelength for which the mirror is designed. Since the wavelength through a material is inversely proportional to the impedance of the material, a quarter-wavelength thickness of a low impedance material will be thicker than a quarter-wavelength thickness of a high impedance material. The latter condition holds for normal incidence.

The operation principle can be understood as follows. Each interface between the two materials contributes a Fresnel-type reflection. For the design wavelength, the optical path length difference between reflections from subsequent interfaces is one half the wavelength; in addition, the reflection coefficients for the interfaces have alternating signs. Therefore, all reflected components from the interfaces interfere constructively, which results in a strong reflection. The achieved reflectivity is determined by the number of bi-layers and by the refractive index contrast between the layer materials. The reflection bandwidth is determined mainly by the index contrast.

Figure 1:
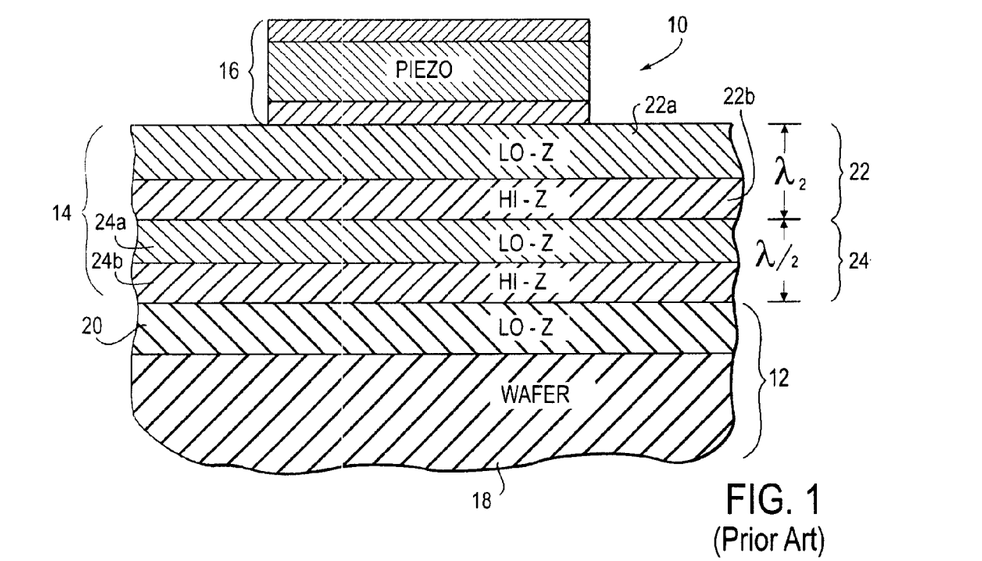
FIG. 1 is a cross sectional view of a piezoelectric device supported over a substrate by a Bragg mirror of the prior art.

FIG. 1 illustrates a resonator assembly 10 including a substrate 12, a Bragg mirror 14 and a standard piezoelectric resonator 16. The substrate 12 can be, for example, a silicon wafer 18 covered with a low impedance ("Z") layer 20, such as an oxide layer. It is to be understood with respect to the example of an acoustical Bragg mirror that the impedance of a layer is its acoustical impedance, and not another type of impedance such as electrical impedance.

The Bragg mirror 14 in this example has two bi-layers 22 and 24. Bi-layer 22 includes a low impedance ("LO-Z") layer 22a and a high impedance ("HI-Z") layer 22b. Similarly, bi-layer 24 includes a LO-Z layer 24a and a HI-Z layer 24b. The HI-Z layers have a relatively high impedance to compression ("acoustical") waves, and usually include a metal such as aluminum or tungsten. The LO-Z layers have relatively low impedance to acoustical waves, and can be, for example, silicon oxide or polymer layers.

The thickness of each layer of the bi-layers 22 and 24 is conventionally set equal to a quarter-wavelength ($\lambda_L/4$) of the incident wave that is to be reflected. That is, each of layers 22a, 22b, 24a and 24b are a quarter-wavelength thick. Since wavelengths are dependent upon the impedance of the material through which they are traveling, the LO-Z layers are thicker than the HI-Z layers. The alternate layers have the characteristics that each layer shows a high contrast in impedance with the adjacent layers. For microwave applications this is electrical impedance, and for BAW/SMR applications it is the acoustic impedance Z, which is a function of the material density and mechanical characteristics E (Young Modulus) and $\nu$ (Poisson Ratio).

The high-contrast bi-layers, each having two layers set to a quarter-wavelength of the incident wave, create a highly efficient mirror for reflecting the incident wave. In applications with piezoelectric resonators, such as resonator 16, this means that the acoustical energy created by the resonator is reflected back to the resonator and is not absorbed into the substrate 12. This allows the resonator to operate more efficiently than if it were supported directly on the substrate.

It should be noted that FIG. 1 illustrates a Bragg reflector having two bi-layers, each tuned for the same wavelength. This is because each bi-layer will reflect only a certain percentage of the acoustical energy. For example, if a bi-layer reflects 90% of the incident wavelength, then two bi-layers will theoretically reflect 99% of the incident wavelength. Depending upon the application, prior art Bragg reflectors can have a single bi-layer or two or more bi-layers, all of the same thickness; where the bi-layer is composed of two layers, each ¼ of the wavelength of the acoustic wave to be reflected.

A problem not addressed by the majority of the prior art is that of reflecting multiple frequencies of acoustic waves. That is, the Bragg mirrors of the majority of the prior art efficiently reflect only a specific wavelength which is twice times the thickness of the Bragg mirror hi-layer (i.e. four times the thickness of each layer of the bi-layer). Of course, by "specific wavelength" it is meant the principal wavelength and wavelengths within a relatively narrow range, e.g. ±20%, of the principal wavelength.

Some devices, such as piezoelectric resonators, develop acoustic waves at other than a primary wavelength. For example, piezoelectric resonators develop both a principal acoustic wave and a "shear" wave which is approximately ½ the wavelength of the principal wave. Bragg mirrors of the majority of the prior art do not effectively reflect other wavelengths other than those to which they are tuned, such as the wavelength of harmonics.

United States Patent Application 20050200433, published Sep. 15, 2005, discloses a bulk acoustic wave filter and method for eliminating unwanted side passbands, wherein a bulk acoustic wave (BAW) filter is fabricated from thin film bulk acoustic wave resonators and a method eliminates unwanted side passbands. This BAW filter comprises a substrate a resonator section and an acoustic mirror section. Further it comprises a detuning component positioned in the resonator section to provide precise passband characteristics and an additional detuning component in the acoustic mirror section to suppress unwanted side-passband characteristics.

These and other limitations of the prior art will become apparent to those of skill in the art upon a reading of the following descriptions and a study of the several figures of the drawing.

SUMMARY

In certain embodiments, set forth by way of example and not limitation, a Bragg mirror comprises a stack of both high and low acoustic impedance layers to efficiently isolate both a bulk principal acoustic mode and shear waves from, for example, a silicon substrate. This exemplary embodiment is useful for the fabrication of both SMR and BAW devices.

In certain exemplary embodiments, shear wave bi-layers are added to the bottom of a conventional Bragg mirror stack. These shear wave bi-layers may, by way of non-limiting example, be designed to be a thickness of nominally $\lambda_S/2$ phase shift for the shear wave mode, and consequently approximately $\lambda_L/4$ phase shift for the longitudinal wave mode if the longitudinal wave mode is about twice the shear wave mode. Additional shear wave mode bi-layers may be added to the bottom of a conventional Bragg mirror stack to improve performance.

In an embodiment, set forth by way of example and not limitation, an integrated device includes a device developing acoustical energy at multiple wavelengths, and an acoustical reflector acoustically coupled to the device and operative to reflect at least a portion of the acoustical energy. The acoustical reflector, for example, may include a first structure configured to reflect a first wavelength of the acoustical energy, and a second structure configured to reflect a second wavelength of the acoustical energy which is different from the first wavelength.

For example, the device may be a solidly mounted resonator or a filter. As further non-limiting example, the filter may be a stack crystal filter or a coupled resonator filter. Other devices which develop acoustical energy at multiple frequencies may also be employed.

In an exemplary embodiment, the first wavelength is the wavelength of a longitudinal wave developed by the device and the second wavelength is the wavelength of a shear wave developed by the device. By way of further non-limiting example, the first wavelength may be approximately twice as long as the second wavelength. In another embodiment a substrate is provided, wherein the acoustical reflector is located between the substrate and the device.

In an embodiment, set forth by way of example and not limitation, a Bragg mirror includes a first bi-layer of a first thickness and a second bi-layer of a second thickness which is different from the first thickness. In this exemplary embodiment, the first bi-layer consists essentially of a first high impedance layer and a first low impedance layer, and the second bi-layer of a second thickness which is different from the first thickness, the second hi-layer consisting essentially of a second high impedance layer and a second low impedance layer. Preferably, the first bi-layer is configured to substantially reflect a first wavelength and the second bi-layer is configured to substantially reflect a second wavelength different from the first wavelength.

In an exemplary embodiment, the first thickness is approximately ½ of the first wavelength and the second thickness is approximately ½ of the second wavelength. In another exemplary embodiment, the Bragg mirror is an acoustical Bragg mirror. In another exemplary embodiment, the first wavelength is the wavelength of a longitudinal wave and wherein the second wavelength is the wavelength of a shear wave. In another exemplary embodiment, the first bi-layer and the second bi-layer are two of three or more bi-layers including a multiplicity of bi-layers. In another exemplary embodiment, each of the multiplicity of bi-layers is selected from one of the first thickness and the second thickness. In another exemplary embodiment, the Bragg mirror is supported by a substrate, and the thinner of the first bi-layer and the second bi-layer is closer to the substrate. In another exemplary embodiment, the Bragg mirror includes two adjacent first bi-layers juxtaposed with a second bi-layer. In another exemplary embodiment, the Bragg mirror includes two adjacent first bi-layers juxtaposed with two adjacent second bi-layers.

In an embodiment, set forth by way of example and not limitation, a method for making a Bragg mirror includes preparing a substrate with a low impedance oxide layer, forming a first bi-layer of a first thickness over the substrate by depositing a first high-impedance material on the prepared substrate and then depositing a first low-impedance material over the first high-impedance material, such that the first bi-layer thickness is approximately ½ of a first wavelength to be reflected, and then forming a second bi-layer of a second thickness over the first bi-layer by depositing a second high-impedance material over the first bi-layer and then depositing a second low-impedance material over the second high-impedance material, such that the second bi-layer thickness is approximately ½ of a second wavelength to be reflected.

In certain embodiments which are used in applications subject to, for example, FCC passband specifications, reduction of insertion loss is important, which is advantageously achieved by certain embodiments. In the case of a transmitter with a BAW filter in series with a Power Amplifier (PA) any insertion loss (in dB) that is eliminated in the filter is equivalent to that much power that PA need not deliver (in dB). Similarly, reduction of insertion loss (in dB) in a receiver filter between the antenna and the first low noise amplifier (LNA) stage is equivalent to that much improvement in noise figure (in dB). The advantageous consequence is an increased autonomy for handheld device due to reduced demand for power from the battery.

An advantage of certain exemplary embodiments is that there is a low transmissivity of shear waves into the Bragg mirror stack while maintaining, or even improving, low transmissivity of the longitudinal waves.

An advantage of certain exemplary embodiments is that classic IC fabrication methods can be used for the basic manufacturing sequences, including depositions, photolithography, and etch processes. MEMS techniques may also be employed for packaging.

Additional advantages of certain exemplary embodiments is that the inherent problem of energy loss via propagation of shear waves into a silicon substrate can be addressed. Certain embodiments are simple to implement in that they do not require modification the optimum $\lambda_L/2$ configuration of the Bragg mirror (where each layer of a bi-layer is $\lambda_L/4$) for the longitudinal wave mode. In certain exemplary embodiments, all that is necessary to create a Dual Mode Bragg ("DMB") mirror is to add at least one more additional Bragg bi-layers to the bottom of a conventional Bragg Mirror.

Still further advantages that can be enjoyed with certain exemplary embodiments include: improved quality factor (Q); larger pass-band for filters built with the resonators (mostly on the top right corner of the pass-band); cleaner characteristic of the transmit signal with in addition a reduced level of insertion loss; reduced insertion loss and reduced ripple due to shear wave modes. The reduction of ripple may improve parameters such a group delay in the passband.

These and other embodiments and advantages will become apparent to those of skill in the art upon a reading of the following descriptions and a study of the several figures of the drawing.

BRIEF DESCRIPTION OF THE DRAWINGS

Several exemplary embodiments will now be described with reference to the drawings, wherein like components are provided with like reference numerals. The exemplary embodiments are intended to illustrate, but not to limit, the invention. The drawings include the following figures.

DETAILED DESCRIPTION OF EXEMPLARY EMBODIMENTS

As noted previously, one quarter-wavelength is an optimum thickness of each layer in a Bragg bi-layer in a mirror to reflect a specific wave. As such, a Bragg bi-layer is sometimes referred to as a quarter-wavelength bi-layer. However, as used herein, we refer to a Bragg bi-layer as a half-wavelength bi-layer, being the acoustical sum of two quarter-wavelength bi-layers. It should also be noted that when referring to parameters such as "thickness", we are referring to acoustical thickness and not necessarily to an absolute thickness.

The type of bi-layer used will determine the type of wave reflected. For example, bi-layers of certain materials reflect electromagnetic energy (e.g. visible light), and bi-layers of other materials reflect acoustical ("compression") energy. Acoustical Bragg mirrors, however, are typically used in environments different from mirrors designed to reflect electromagnetic energy, e.g. in solid state circuitry. As such, the problems that acoustical Bragg mirrors experience may be substantially different than the problems of electromagnetic Bragg mirrors. Nonetheless, some of the improvements disclosed find applicability with electromagnetic Bragg mirrors as well as acoustical Bragg mirrors.

Figure 2:
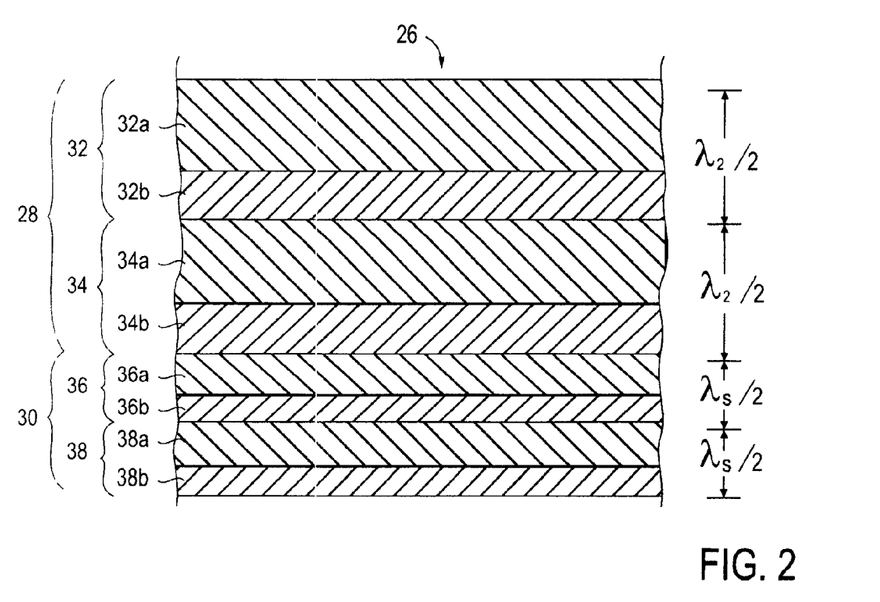
FIG. 2 is a cross sectional view of a Bragg mirror of an exemplary embodiment.

In one embodiment, illustrated by way of example and not limitation in FIG. 2 and referred to herein as a "Dual Mode Bragg mirror," an acoustical reflector simultaneously provides an optimum acoustic isolation from the silicon substrate for both a principal acoustic bulk or "longitudinal wave" mode (the piston-like mode that operates on, for example, a SMR) and a shear wave mode. This isolation is accomplished by forming a mirror that reflects the energy of both modes back into the SMR versus allowing them to propagate into the lossy silicon substrate. Advantageously, this reduces the energy loss from the SMR by limiting propagation into the substrate for both modes.

In FIG. 2, a Dual Mode Bragg mirror 26 can be interposed between an acoustic source (such as the piezoelectric resonator 16 of FIG. 1) and a substrate (such as the substrate 12 of FIG. 1). In this example, the Dual Mode Bragg mirror 26 includes a longitudinal wave reflector 28 stacked on top of a shear wave reflector 30. The longitudinal wave reflector 28 has, in this example, two bi-layers 32 and 34, and the shear wave reflector 30 has, also in this example, two bi-layers 36 and 38.

With respect to longitudinal wave reflector 28, the bi-layers 32 and 34 are each one-half of the wavelength of the longitudinal wave. Each bi-layer includes a LO-Z and a HI-Z layer to promote the reflection of the longitudinal wave, i.e. the layers are each one-quarter of the wavelength of the longitudinal wave. For bi-layer 32, layer 32a is a LO-Z layer and layer 32b is a HI-Z layer. For bi-layer 34, layer 34a is a LO-Z layer and layer 34b is a HI-Z layer.

With respect to shear wave reflector 30, the bi-layers 36 and 38 are each one-half of the wavelength of the shear wave. Each bi-layer includes a LO-Z and a HI-Z layer to promote the reflection of the shear wave. For bi-layer 36, layer 36a is a LO-Z layer and layer 36b is a HI-Z layer. For bi-layer 38, layer 38a is a LO-Z layer and layer 38b is a HI-Z layer.

The LO-Z and HI-Z layers can include conventional materials as are well known to those of skill in the art. For example, the LO-Z material can be an oxide, such as a silicon-oxide, or a polymer, such as BCB, or other low-impedance materials. The HI-Z material can be a metal, such as aluminum, tungsten or copper, or other high-impedance materials. The choice of materials is not critical as long as they are process compatible.

The high impedance layers may be selected, for example, from the group consisting essentially of AlN, W, TiW, $Si_3N_4$ and Mo. The low impedance layers may be selected, for example, from the group consisting essentially of $SiO_2$, SiOC, BCB, and polymers.

The LO-Z and HI-Z may be formed by conventional processes well known to those skilled in the art. For example, an oxide layer can be formed by chemical vapor deposition (CVD) or the exposure of, for example, a silicon layer to the environment of an oxidizing furnace. Polymer layers can be formed, for example, by conventional techniques such as spin-coating. Metal layers can be formed, for example, by sputtering techniques.

The various LO-Z and HI-Z layers may be patterned or un-patterned. If patterned, conventional techniques such as photolithography may be employed. Other techniques will also be apparent to those of skill in the art. The Dual Mode Bragg mirror of this example as well as other Bragg mirror configurations which reflect multiple wavelengths can be formed over substrates and combined with acoustic energy generating devices such as piezoelectric resonators by conventional techniques.

The relative thicknesses of the layers of a bi-layer are dependent upon their impedance and process requirements, as is well known to those of skill in the art. These thicknesses may be determined by the material properties of the high and low acoustic impedance layers and the frequency where they are to be approximately ¼ wavelength thick, as shown by way of example and not limitation in Tables 1 and 2.

To provide an acceptable level of isolation (i.e. preferably at least 95% and more preferably 99% or better reflection) for the shear waves by preventing their propagation into the substrate, embodiments provide a Bragg mirror with a plurality of bi-layers of high and low acoustic impedance materials. The thicknesses of these acoustic materials, in this exemplary embodiment, correspond to a quarter wave thickness ($\lambda_S/4$) for the shear wave mode, where $\lambda_S$ is the wavelength of the shear wave mode, such that a bi-layer is $\lambda_S/2$. As a consequence of the acoustic velocity of the shear wave mode for SMRs being approximately half that of the principal bulk mode this corresponds, in this exemplary embodiment, to a thickness nominally one eighth the wavelength ($\lambda_L/8$) of the longitudinal wave mode, where $\lambda_L$ is the wavelength of the longitudinal wave mode. The ($\lambda_S/4$) bi-layers reduce transmission of the shear waves into the silicon substrate.

In an embodiment, the shear wave bi-layer(s) is placed below the longitudinal bi-layer(s). In another embodiment, the shear wave bi-layer(s) is placed above the longitudinal bi-layer(s). In still other embodiments, more than two bi-layers are employed. In still further embodiments different thicknesses and ratios of thicknesses between the bi-layers are used. In some embodiments, more than two wavelengths are reflected. Some of these various combinations will be discussed by way of example, and without limitation, with reference to various figures of the drawing.

The exemplary embodiment of FIG. 2 includes a composite of multiple bi-layers of alternating high and low acoustic impedance layers. In the first, upper set of bi-layers each acoustic layer is nominally $\lambda_L/4$ thick with respect to the longitudinal wave mode, which has a wavelength $\lambda_L$. In the second, lower set of bi-layers each acoustic layer is nominally $\lambda_S/4$ thick with respect to the longitudinal wave mode, which has a wavelength $\lambda_S$. This structure is designed to provide a high reflection coefficient for both the longitudinal and shear wave modes at the top of the Bragg mirror stack.

With continuing reference to the embodiment of FIG. 2, the efficiency of two bi-layers (each consisting of a pair of layers $\lambda_L/4$ thick for the longitudinal wave mode) is shown to provide acceptable isolation from the silicon substrate (over 99% reflection when calculated using 1D Mason-like modeling) for the longitudinal mode. The additional bi-layer(s), each consisting of a pair of layers $\lambda_S/4$ thick for the shear wave mode, which are each approximately $\lambda_L/8$ thick for the longitudinal wave mode, is located closest to the substrate so as not to potentially interfere with the isolation of the longitudinal wave mode, in this exemplary embodiment.

FIG. 2 illustrates an embodiment well suited for use with a Solidly Mounted Resonator (SMR) as illustrated in FIG. 1. Again, $\lambda_L$ is the wavelength of the longitudinal wave mode, or "piston" mode. The two lower bi-layers are "tuned" for the shear mode (nominally $\lambda_S/2$ thick each). Any number of bi-layers may be used (1, 2, 3 . . . ), but typically 1 or 2 bi-layers for each mode are used in practical Bragg mirror reflector stacks. Consequently, due to the approximate relationship of $\lambda_S \approx \lambda_L/2$, the $\lambda_L/2$ bi-layers are approximately $\lambda_S$, and hence transparent to the shear waves as will be shown below. Similarly the lower set of bi-layers that are $\lambda_S/2$ are consequently $\lambda_L/4$, in this example.

FIG. 2 presents a configuration where each layer belonging to the Bragg mirror is left un-patterned. In the case one or several of the layers are made out a conductive material, for instance any metal, it will be appreciated by those skilled in the art that patterning of these conductive layers helps prevent parasitic capacitive coupling between resonators within a filter device.

To understand the operation of this exemplary structure, and of Bragg mirrors in general, we start with the transmission line impedance equation, that computes the input impedance, $Z_i$, for a section of transmission line of phase shift $\theta_i$, with characteristic impedance $Z_i$ and terminating impedance $Z_{i-1}$:

$$Z_i = Z_i \left[ \frac{Z_{i-1}\cos\theta_i + jZ_i\sin\theta_i}{Z_i\cos\theta_i + jZ_{i-1}\sin\theta_i} \right] \quad \text{(equation 1)}$$

Where:
i=1 . . . n where i=1 is the layer next to the substrate, and i=n is the layer next to the piezo (AlN) layer;
$Z_i$ is the acoustic impedance of the considered layer i;
$Z_{i-1}$ is the acoustic impedance of the previously considered layer; and
$\theta_i$ is the phase shift across layer i:

$$\theta_i = \frac{\omega \times d_i}{v_i} \quad \text{(equation 2)}$$

Where:
$v_i$ is the velocity of the acoustic wave in layer i.
$d_i$ is the thickness of layer i.
$\omega$ is the radian frequency.
The reflection coefficient, R, at the top surface of the Bragg mirror is computed using the standard equation:

$$R = \frac{Z_n - Z_p}{Z_n + Z_p} \quad \text{(equation 3)}$$

Where:
$Z_n$ is the input impedance at the surface of layer n, which is adjacent to the bottom of the piezo electric (AlN) layer; and
$Z_p$ is the acoustic impedance of the piezo electric (AlN) material.

The equations above are used to compute the reflection coefficient, R, at the top of the Bragg mirror for both the longitudinal and shear wave modes using the acoustic impedances and velocities listed in Table 1, below.

TABLE 1

| | Acoustic impedance and velocity for longitudinal and shear wave modes | | | |
| --- | --- | --- | --- | --- |
| Material | Longitudinal wave acoustic velocity (m/s) | Longitudinal wave acoustic impedance ($10^6$ kg/m²s) | Shear wave acoustic velocity (m/s) | Shear wave acoustic impedance ($10^6$ kg/m²s) |
| Al | 6422 | 17.3 | 3110 | 8.4 |
| W | 5230 | 101 | 2860 | 55.2 |
| AlN | 10400 | 34 | 6036 | 19.7 |
| SiO2 | 5970 | 13.1 | 3760 | 8.3 |

TABLE 1-continued

Acoustic impedance and velocity for
longitudinal and shear wave modes

| Material | Longitudinal wave acoustic velocity (m/s) | Longitudinal wave acoustic impedance ($10^6$ kg/m²s) | Shear wave acoustic velocity (m/s) | Shear wave acoustic impedance ($10^6$ kg/m²s) |
|---|---|---|---|---|
| Si | 8847 | 19.3 | 5300 | 11.6 |
| SiN | 11150 | 36.2 | 6160 | 20 |
| Mo | 6660 | 48.6 | 3860 | 28 |

The reflection coefficient can be converted into an associated transmission coefficient (also called transmissivity) into the mirror, T, (in dB) by:

$$T_{dB} = 10\ \log(1-|R|^2) \qquad \text{(equation 4)}$$

Some of the various configurations of exemplary embodiments will be illustrated, by way of example, in FIGS. 3-7. All of these exemplary embodiments show various permutations of bi-layers of multiple thicknesses, to reflect multiple wavelengths. Again, by "thickness" it is meant thickness in terms of the wavelength being propagated through the layer, rather than an absolute thickness, although it will be appreciated that for a given wavelength and a give material that the "thickness" will correspond to an absolute thickness as well. It will be apparent to those of skill in the art that these and other variations are also possible for the reflection of various wavelengths in alternate embodiments.

Figure 3A:
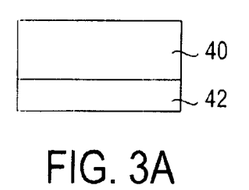
FIGS. 3A and 3B illustrate exemplary embodiments including two bi-layers of two different thickness.
Figure 3B:
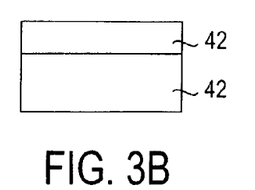

FIGS. 3A and 3B illustrate, by way of example and not limitation, the combination of two bi-layers of two thicknesses. In FIG. 3A, a thicker bi-layer 40 (similar to, for example, bi-layer 32 of FIG. 2) is formed on top of a thinner bi-layer 42 (similar to, for example, bi-layer 36 of FIG. 2). In FIG. 3B, the other permutation of these two bi-layers is illustrated. An advantage of both of these exemplary embodiments is that the fewest number of bi-layers are used to reflect two different wavelengths, reducing device and manufacturing complexity and, therefore, cost. A disadvantage of these exemplary embodiments is that a significant percentage of a given incident wave will penetrate a single bilayer. It may also be advantageous in certain embodiments to have the layer to the dominant wavelength to be on top of the layer to the non-dominant wavelength.

Figure 4A:
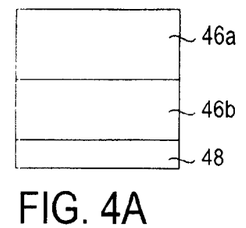
FIGS. 4A-4C and 5A-5C illustrate exemplary embodiments including three bi-layers of two different thickness.
Figure 4B:
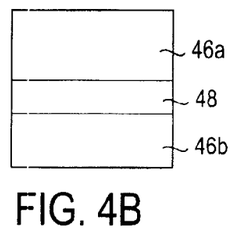
Figure 4C:
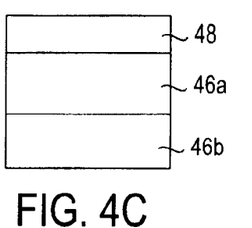

FIGS. 4A, 4B and 4C illustrate, by way of example and not limitation, the combination of three bi-layers, where two of the bi-layers are relatively thicker than the third bi-layer. In FIG. 4A, bi-layers 46a and 46b are of the same thickness and are formed on top of bi-layer 48, which is thinner. This arrangement gives better reflectivity of the wavelength corresponding to bi-layers 46a and 46b, since it must penetrate both bi-layers to avoid reflection. FIGS. 4B and 4C illustrate other permutations of these three bi-layers.

Figure 5A:
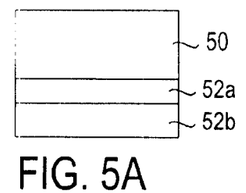
Figure 5B:
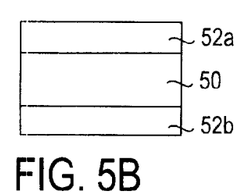
Figure 5C:
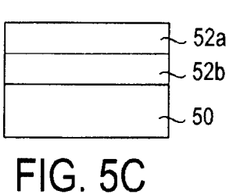

FIGS. 5A, 5B and 5C illustrate, by way of example and not limitation, the combination of three bi-layers, where two of the bi-layers are relatively thinner than the third bi-layer. In FIG. 5A, bi-layers 52a and 52b are of the same thickness and are formed below bi-layer 50, which is thicker. This arrangement gives better reflectivity of the wavelength corresponding to bi-layers 52a and 52b, since it must penetrate both bi-layers to avoid reflection. FIGS. 5B and 5C illustrate other permutations of these three bi-layers.

Figure 6A:
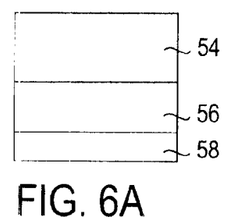
FIGS. 6A-6C illustrate exemplary embodiments including three bi-layers of three different thicknesses.
Figure 6B:
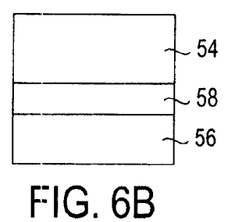
Figure 6C:
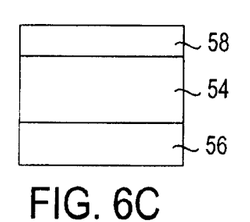

FIGS. 6A, 6B and 6C illustrate, by way of example and not limitation, the combination of three bi-layers of three thicknesses. In FIG. 6A, for example, bi-layer 54 is the thickest, bi-layer 56 is less thick than bi-layer 54, and bi-layer 58 is the thinnest layer. Each of bi-layers 54, 56 and 58 is "tuned" to reflect a wavelength which is approximately twice its "thickness." FIGS. 6B and 6C illustrate, by way of example, several additional permutations of bi-layers 54, 56 and 58, although other permutations also exist. An advantage of this arrangement is that three different frequencies are efficiently reflected by the Bragg mirror. This technique can be extended to additional layers to reflect other multiple frequency waveforms.

Figure 7A:
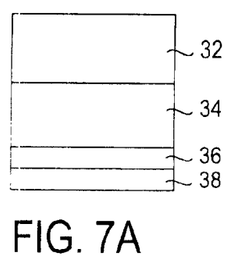
FIGS. 7A-7C illustrate exemplary embodiments including four bi-layers of two different thicknesses.
Figure 7B:
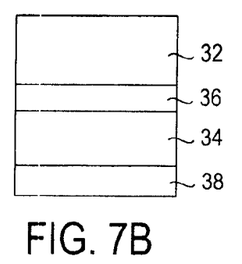
Figure 7C:
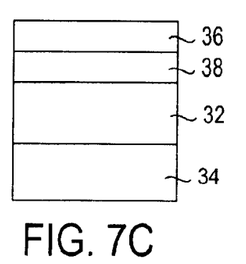

FIGS. 7A, 7B and 7C illustrate, by way of example and not limitation, the combination of four bi-layers, of two thicknesses. FIG. 7A illustrates, in a more schematic form, the Dual Mode Bragg mirror illustrated in FIG. 2, with like reference numbers referring to like bi-layers. In FIG. 7A, bi-layers 32 and 34 are of a first thickness, while bi-layers 36 and 38 are of a second thickness which is less than the first thickness. This arrangement efficiently reflects two wavelengths, e.g. a longitudinal wave wavelength and a shear wave wavelength as generated by a piezoelectric resonator. FIGS. 7B and 7C illustrate, by way of example, several additional permutations of bi-layers 32, 34, 36 and 38, although other permutations also exist.

Figure 8:
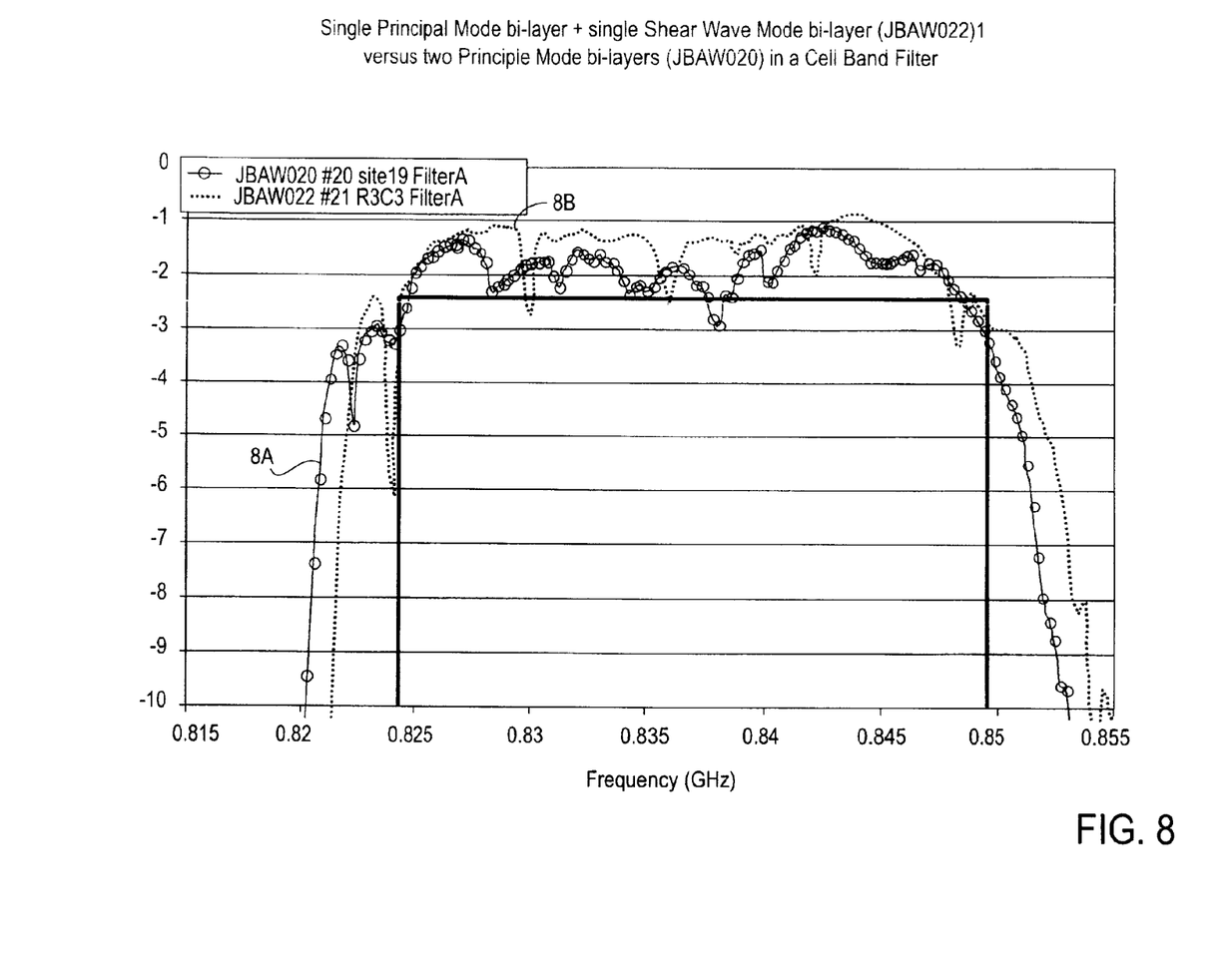
FIG. 8 is a graph comparing the performance of the embodiment of FIG. 2 to the prior art as illustrated in FIG. 1.

FIG. 8 shows the measured performance of a Dual Mode Bragg mirror as illustrated in FIG. 3A versus a standard dual bi-layer Bragg mirror designed solely to provide isolation of the longitudinal wave mode as shown in FIG. 1. The trace labeled 8A is a standard stack of two bi-layers as shown in FIG. 1 that are both tuned to the longitudinal wave mode. The trace labeled 8B is a single bi-layer 40 tuned to the longitudinal wave mode stacked on top of a single bi-layer 42 tuned to the shear wave mode as shown in FIG. 3A. With the embodiment of FIG. 3A, the elimination of one of the longitudinal wave mode bi-layers has resulted in deeper nulls approximately every 6 MHz due to increased energy loss into the substrate (the silicon substrate thickness supports resonances at multiples of this frequency). This spurious mode is caused by the substrate presenting a lossy boundary condition at the bottom of the Bragg Mirror at N×6 MHz, where N=1, 2, 3 . . . . The spurious longitudinal wave mode interval (in this case 6 MHz) will change proportionally with substrate thickness. These spurious mode nulls are diminished if a second bi-layer, tuned to one half wave thickness for each bi-layer at the longitudinal wave mode, as in the example of FIG. 4A. However, it is important to note in FIG. 8 that the average insertion loss in the passband (824 to 849 MHz) is reduced by about 0.5 dB due to isolation of the shear wave mode from the silicon substrate by the bi-layer 42 shown in FIG. 3A.

Figure 9:
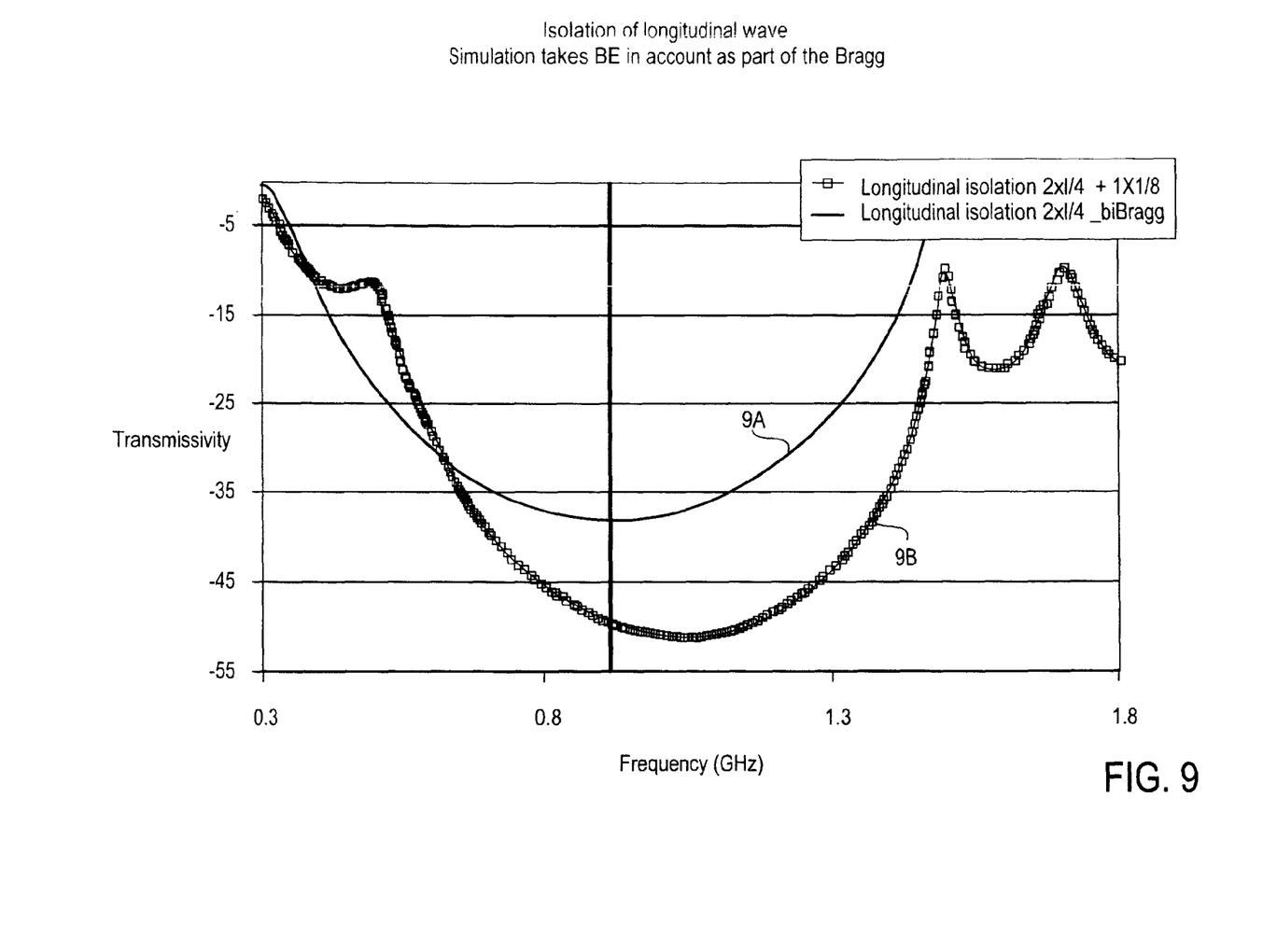
FIG. 9 is a graph illustrating the isolation of a longitudinal wave with the embodiment of FIG. 2.

To better understand the benefits of various embodiments, we consider the prior art Bragg mirror consisting of only two bi-layers (each bi-layer consists of a high and low impedance acoustic impedance layer), as shown in FIG. 1. For use in Cellular Band (~900 MHz) the dimensions shown in Table 2, found below, can be used, by way of example. The resulting transmission coefficients for both the longitudinal and shear wave modes versus frequency are shown in by trace 9A of FIG. 9 and trace 10A of FIG. 10. For this example the typical dual $\lambda_L/2$ bi-layer Bragg mirror of FIG. 1 transforms an arbitrary impedance presented to the bottom of the mirror stack by $SiO_2$ layer 20 into a high reflection coefficient at the top of the Bragg mirror $SiO_2$ layer 22a. This high reflection coefficient results in a low transmission coefficient (i.e. low transmissivity) into the Bragg mirror, for example at 900 MHz the transmissivity is −36 dB as shown in FIG. 9.

TABLE 2

Layer thickness v. layer for a typical dual λ/4 layer ("by-layer") Bragg mirror of FIG. 1

| Layer no. | Layer | Thickness (μm) | Nominal phase shift, $\theta_i$, across each layer of a bi-layer for Longitudinal wave | Approximate phase shift, $\theta_i$, across each layer of a bi-layer for Shear wave |
|---|---|---|---|---|
| 22a | SiO$_2$ | 1.6 | $\lambda_L/4$ | $\lambda_S/2$ |
| 22b | W | 1.46 | $\lambda_L/4$ | $\lambda_S/2$ |
| 24a | SiO$_2$ | 1.6 | $\lambda_L/4$ | $\lambda_S/2$ |
| 24b | W | 1.46 | $\lambda_L/4$ | $\lambda_S/2$ |
| 20 | SiO2 | 1.8 | | |
| 18 | Si | >200 | | |

Figure 10:
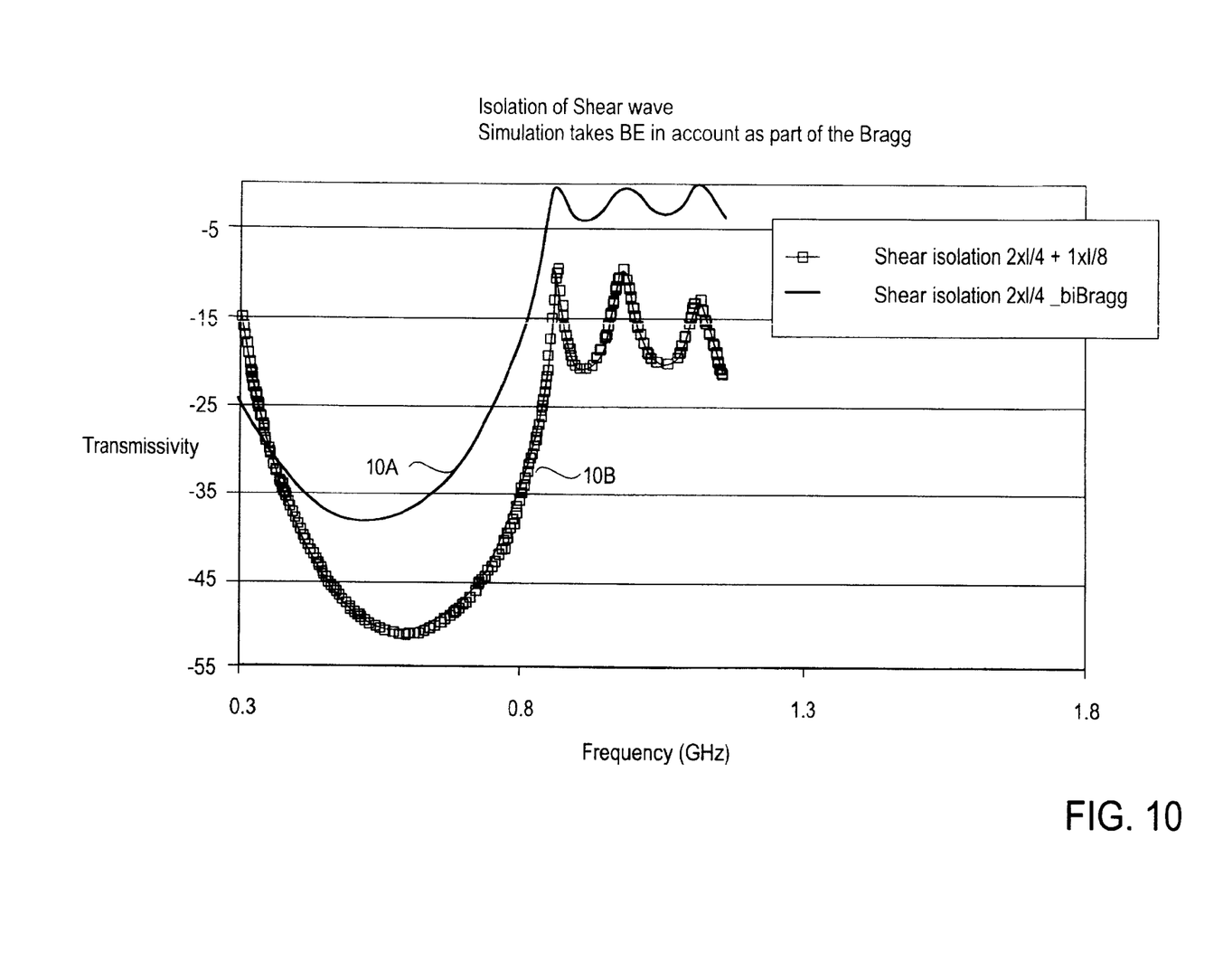
FIG. 10 is a graph illustrating the isolation of a shear wave with the embodiment of FIG. 2.

The shortcoming of this prior art $\lambda_L/2$ bi-layer Bragg mirror for this application is that bi-layers 22 and 24 of FIG. 1 are nominally $\lambda_S$ for the shear wave. According to the transmission line impedance equation above these layers become transparent to the shear wave and effectively transfer the arbitrary impedance of layer 20 up to layer 22a at the top of the Bragg mirror stack. This can lead to significant transmission of the shear waves into the substrate 12. For example, trace 10A of FIG. 10 shows that less than 5 dB of attenuation occurs of the shear waves at 900 MHz.

With reference to the embodiment of FIG. 4A, the addition of a shear wave mode bi-layer transforms the arbitrary impedance presented at the top of the substrate (not shown, typically an oxide layer over a silicon substrate as in FIG. 1) into a high reflection coefficient at the top of bi-layer 48, which reduces the transmissivity of the shear wave mode into bi-layer 48 from bi-layer 46b. The transmission line impedance equation shows that since the bi-layers 46a and 46b are all approximately $\lambda_S$ phase shift for the shear wave mode that the high reflection coefficient condition is effectively transferred from the top of bi-layer 48 to the top of bi-layer 46a. In effect these $\lambda_S$ bi-layers are transparent to the shear wave mode. This reduces the transmissivity of the shear wave mode into the top of the Bragg mirror stack (i.e. the top surface of bi-layer 46a), as shown in trace 10B of FIG. 10.

Additionally the transmissivity of the longitudinal wave mode is also reduced, as shown by trace 9B in FIG. 9, due to the shear wave mode bi-layer 48a at the bottom of the Bragg mirror stack of FIG. 4A presenting a more optimal impedance to the bottom of bilayer 46b.

Figure 11:
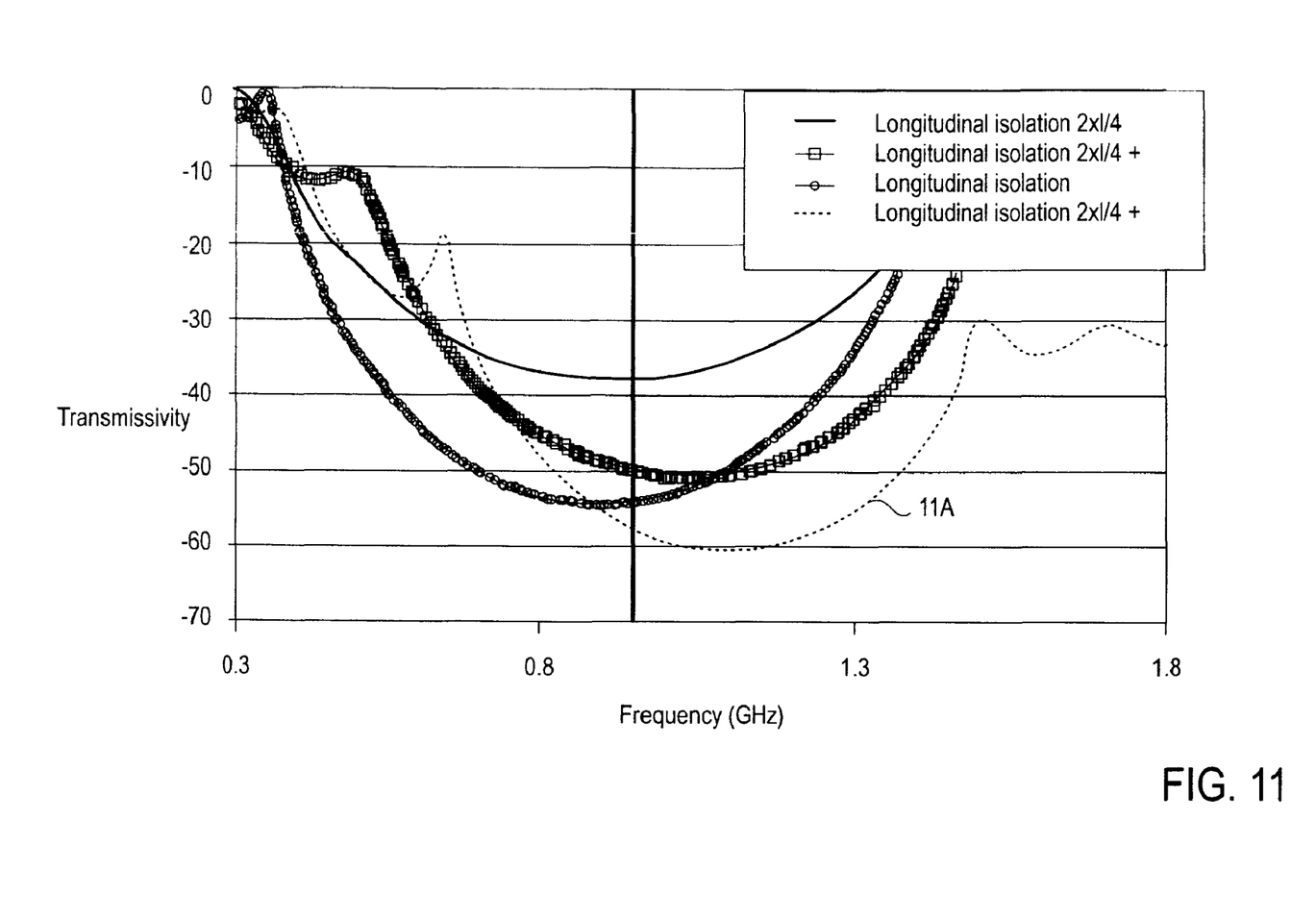
FIG. 11 is a graph illustrating the isolation of a longitudinal wave with various combinations of bi-layers.
Figure 12:
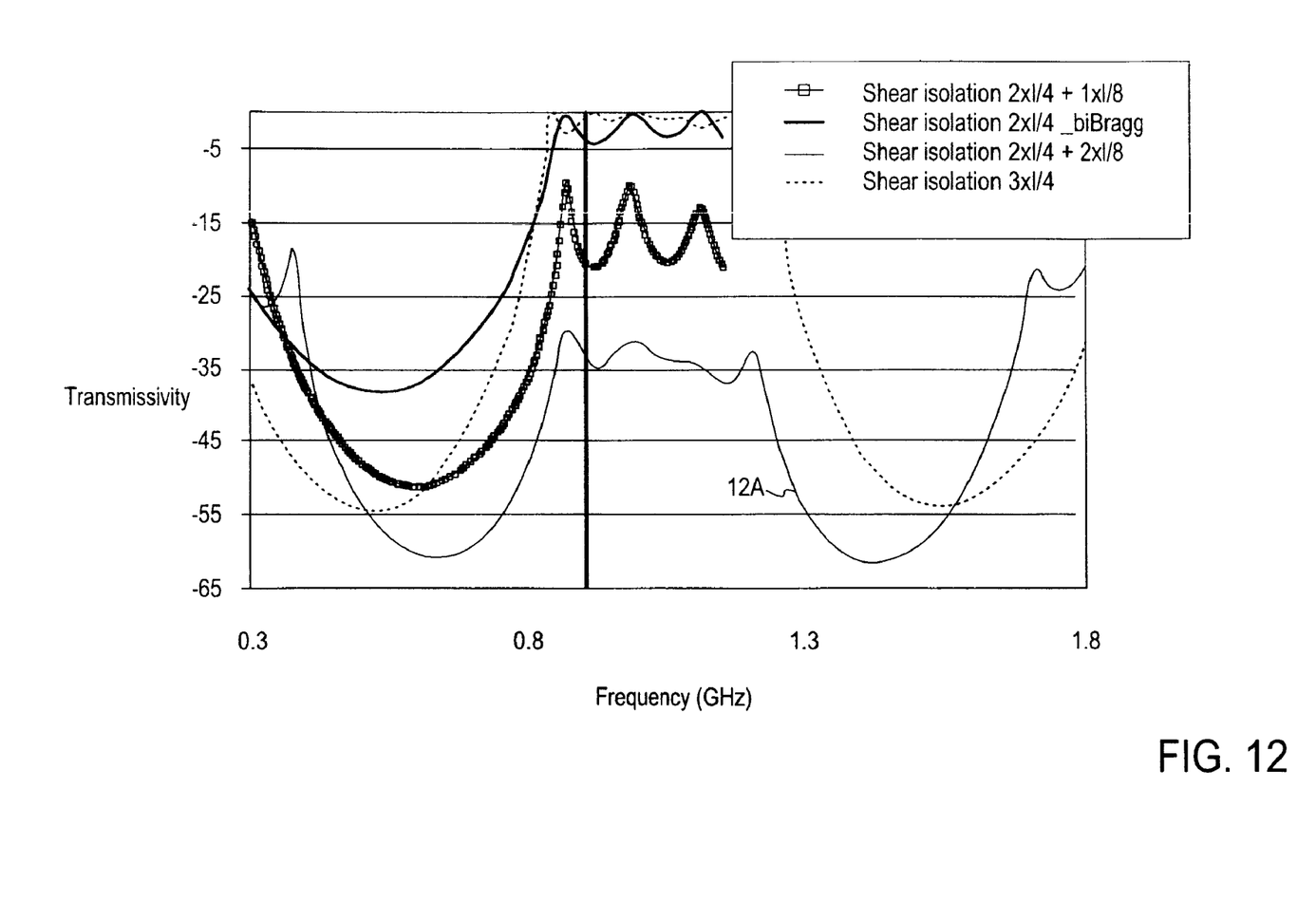
FIG. 12 is a graph illustrating the isolation of a shear wave with various combinations of bi-layers.

Further improvement is obtained by adding a second shear wave mode bi-layer as shown in FIG. 2, i.e. there are two shear wave mode bi-layers 36 and 38. Trace 12A of FIG. 12 shows that the transmissivity for the shear wave mode is reduced (i.e. improved) from nominally −15 dB to −35 dB with the addition of the additional shear wave bi-layer, as opposed to only one shear wave mode bi-layer of FIG. 4A. Also the transmissivity of the longitudinal wave mode is improved from −50 dB to better than −55 dB as shown in by trace 11A of FIG. 11. Also plotted on FIGS. 11 and 12 are other combinations of bi-layers for comparative purposes.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part.

It is therefore intended that the claims be interpreted in accordance with the true spirit and scope of the invention without limitation or estoppel.

What is claimed is:

1. Bragg mirror comprising:
   two adjacent first bi-layers, each of a first thickness, each of said first bi-layers consisting essentially of a first high impedance layer and a first low impedance layer; and
   a second bi-layer juxtaposed with said two adjacent first bi-layers, said second bi-layer of a second thickness which is different from said first thickness, said second bi-layer consisting essentially of a second high impedance layer and a second low impedance layer;
   whereby each said first bi-layer is configured to substantially reflect a first wavelength and said second bi-layer is configured to substantially reflect a second wavelength different from said first wavelength.

2. A Bragg mirror as recited in claim 1 wherein said first thickness is approximately ½ of said first wavelength and wherein said second thickness is approximately ½ of said second wavelength.

3. A Bragg mirror as recited in claim 2 wherein said Bragg mirror is an acoustical Bragg mirror.

4. A Bragg mirror as recited in claim 3 wherein said first wavelength is the wavelength of a longitudinal wave and wherein said second wavelength is the wavelength of a shear wave.

5. A Bragg mirror as recited in claim 3 wherein said first bi-layer and said second bi-layer are two of three or more bi-layers comprising a multiplicity of bi-layers.

6. A Bragg mirror as recited in claim 5 wherein each of said multiplicity of bi-layers is selected from one of said first thickness and said second thickness.

7. A Bragg mirror as recited in claim 6 wherein said Bragg mirror is supported by a substrate, and the thinner of said first bi-layer and said second bi-layer is closer to said substrate.

8. A Bragg mirror as recited in claim 1 wherein said Bragg mirror includes two adjacent first bi-layers juxtaposed with two adjacent second bi-layers.

9. A Bragg mirror as recited in claim 1 wherein said high impedance layers are selected from the group consisting essentially of AlN, W, TiW, Si$_3$N$_4$ and Mo.

10. A Bragg mirror as recited in claim 1 wherein said low impedance layers are selected from the group consisting essentially of SiO$_2$, SiOC, BCB, and polymers.

11. A method for making a Bragg mirror comprising:
    preparing a substrate;
    forming two adjacent first bi-layers, each of a first thickness over said substrate by forming a first high-impedance material on said prepared substrate at one-quarter of a wavelength of a first wavelength to be reflected and then forming a first low-impedance material over said first high-impedance material at one-quarter of a wavelength of said first wavelength to be reflected, such that said first bi-layer is one-half of a wavelength of said first wavelength to be reflected; and
    forming a second bi-layer juxtaposed with said two adjacent first bi-layers, said second bi-layer of a second thickness over said first bi-layer by forming a second high-impedance material on said prepared substrate at one-quarter of a wavelength of a second wavelength to be reflected and then forming a second low-impedance material over said second high-impedance material at one-quarter of a wavelength of said second wavelength to be reflected, such that said second bi-layer is one-half of a wavelength of said second wavelength to be reflected;

whereby each said first bi-layer is configured to substantially reflect said first wavelength and said second bi-layer is configured to substantially reflect said second wavelength different from said first wavelength.

12. A method for making a Bragg mirror as recited in claim 11, wherein said first high impedance material and said second high impedance material are different thicknesses of the same material, and wherein said first low impedance material and said second low impedance material are different thicknesses of the same material.

* * * * *